United States Patent
Choi et al.

(10) Patent No.: US 7,416,904 B2
(45) Date of Patent: Aug. 26, 2008

(54) METHOD FOR FORMING DIELECTRIC LAYER OF CAPACITOR

(75) Inventors: Jae-Hyoung Choi, Kyungki-do (KR);
Cha-Young Yoo, Kyungki-do (KR);
Suk-Jin Chung, Kyungki-do (KR);
Wan-Don Kim, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 933 days.

(21) Appl. No.: 10/293,530

(22) Filed: Nov. 12, 2002

(65) Prior Publication Data
US 2003/0224567 A1 Dec. 4, 2003

(30) Foreign Application Priority Data
May 31, 2002 (KR) .............................. 2002-30710

(51) Int. Cl.
*H01L 21/00* (2006.01)
*H01L 21/8242* (2006.01)
*H01L 21/8222* (2006.01)
*H01L 21/20* (2006.01)

(52) U.S. Cl. .......................... 438/3; 438/240; 438/381; 438/329

(58) Field of Classification Search ......... 438/239–240, 438/3, 381, 242, 329, 116
See application file for complete search history.

(56) References Cited

U.S. PATENT DOCUMENTS

| | | | | |
|---|---|---|---|---|
| 4,371,421 A * | 2/1983 | Fan et al. | ....................... | 117/45 |
| 5,492,859 A * | 2/1996 | Sakaguchi et al. | .......... | 438/459 |
| 5,495,823 A * | 3/1996 | Kobayashi | ...................... | 117/8 |
| 5,587,870 A * | 12/1996 | Anderson et al. | ........... | 361/313 |
| 5,688,724 A * | 11/1997 | Yoon et al. | ................... | 438/778 |
| 5,788,447 A * | 8/1998 | Yonemitsu et al. | .......... | 414/217 |
| 5,893,949 A * | 4/1999 | King et al. | .................... | 117/97 |
| 5,970,352 A * | 10/1999 | Shiozawa et al. | ........... | 438/300 |
| 6,218,233 B1 * | 4/2001 | Takemura | ................... | 438/240 |
| 6,232,248 B1 * | 5/2001 | Shinriki et al. | .............. | 438/785 |
| 6,270,587 B1 * | 8/2001 | Motoki et al. | ............... | 148/33.4 |
| 6,297,527 B1 * | 10/2001 | Agarwal et al. | ............. | 257/306 |
| 6,313,047 B2 * | 11/2001 | Hasebe et al. | ............... | 438/785 |
| 6,320,244 B1 * | 11/2001 | Alers et al. | ................... | 257/534 |
| 6,326,316 B1 * | 12/2001 | Kiyotoshi et al. | ........... | 438/763 |
| 6,368,945 B1 * | 4/2002 | Im | ............................. | 438/487 |
| 6,528,328 B1 * | 3/2003 | Aggarwal et al. | ............. | 438/3 |
| 6,544,834 B1 * | 4/2003 | Sugawara et al. | ........... | 438/240 |
| 6,596,547 B2 * | 7/2003 | Aggarwal et al. | ............. | 438/3 |

(Continued)

*Primary Examiner*—Chuong Anh Luu
(74) *Attorney, Agent, or Firm*—Marger Johnson & McCollom, P.C.

(57) ABSTRACT

A fabrication method for forming a semiconductor device having a capacitor is provided. A capacitor dielectric layer is formed by depositing a first layer and a second layer. The second layer is a major portion of the capacitor dielectric layer. The first layer acts as a seed layer, while the second layer is expitaxially grown. The material of the second layer as deposited is partially crystal. Nuclear generation and crystal growth occur separately so that the crystalline characteristic of the capacitor dielectric layer and the capacitance characteristic of the capacitor are enhanced. Moreover, the capacitor dielectric layer is crystallized at a relatively low temperature or for a relatively short time, thereby reducing leakage current as well as reducing deformation in the lower electrode. Optionally, The material of the second layer as deposited is not partially crystal but amorphous.

37 Claims, 7 Drawing Sheets

U.S. PATENT DOCUMENTS

| | | |
|---|---|---|
| 6,693,044 B1 * | 2/2004 | Yamazaki et al. ............ 438/745 |
| 6,815,221 B2 * | 11/2004 | Kim et al. ....................... 438/3 |
| 2001/0018267 A1 * | 8/2001 | Shinriki et al. ............... 438/680 |
| 2001/0024853 A1 * | 9/2001 | Wallace et al. ............... 438/240 |
| 2001/0027031 A1 * | 10/2001 | Hasebe et al. ............... 438/785 |
| 2002/0006674 A1 * | 1/2002 | Ma et al. ......................... 438/3 |
| 2003/0008521 A1 * | 1/2003 | Bojarczuk et al. ............ 438/752 |
| 2003/0013263 A1 * | 1/2003 | Basceri et al. ............... 438/381 |
| 2003/0020122 A1 * | 1/2003 | Joo et al. ..................... 257/381 |
| 2003/0085426 A1 * | 5/2003 | Kondo et al. ................. 257/347 |
| 2003/0119251 A1 * | 6/2003 | Aggarwal et al. ............ 438/239 |

\* cited by examiner

METHOD FOR FORMING DIELECTRIC LAYER OF CAPACITOR

This application relies for priority upon Korean Patent Application No. 2002-30710, filed on May 31, 2002, the contents of which are herein incorporated by reference in their entirety.

FIELD OF THE INVENTION

The present invention relates to method of fabricating a semiconductor device and, more specifically, to method of fabricating a capacitor using high dielectric constant material as a capacitor dielectric layer.

BACKGROUND OF THE INVENTION

Generally, a DRAM (Dynamic Random Access Memory) device includes a plurality of unit cells, each of which comprises a MOS transistor and a storage capacitor. In continuing the trend of higher memory capacity, the size of the unit cell has been continuously decreased in order to increase the packing density of the DRAM device. The reduced cell size results in a decrease in capacitor area of the unit cell. The decreased capacitor area means low cell capacitance, which often induces problems like as low read-out capability and soft error.

One proposal to solve the above-mentioned problems is to use high dielectric constant material as a capacitor dielectric layer, which constitute a capacitor together with a lower electrode and an upper electrode. Typical examples of the high dielectric constant material are tantalum oxide ($Ta_2O_5$) and BST (($Ba,Sr$)$TiO_3$). The material of the lower electrode or the upper electrode is required to have a high work function value and not to be reactive with the capacitor dielectric layer. A typical example of the material of the lower and the upper electrodes is a noble metal, which includes platinum, ruthenium, iridium, rhodium and osmium.

FIG. 1 is cross-sectional views illustrating a conventional method for forming a capacitor using tantalum oxide layer as a capacitor dialectic layer. Referring to FIG. 1, a lower electrode 20 is formed on a substrate 10. The material of the lower electrode 20 is ruthenium. A capacitor dielectric layer 25 is deposited on the lower electrode 20. The material of the dielectric layer 25 is tantalum oxide. The thickness of the dielectric layer 25 is 140~160 Å. The dielectric layer 25 is crystallized by a thermal treatment at 700° C. or more. Subsequently, an upper electrode 30 is formed on the crystallized dielectric layer 25, thereby completing a capacitor 30 on the substrate 10. The material of the upper electrode 30 is ruthenium.

FIG. 2 is a graph showing a change in equivalent oxide thickness value by the crystallization process. The equivalent oxide thickness value represents an effective thickness of a capacitor dielectric layer of a capacitor on the assumption that the capacitor dielectric layer was made of silicon oxide. Therefore, in general, higher equivalent oxide thickness value means lower capacitance per unit capacitor area. Referring to FIG. 2, the vertical axis represents equivalent oxide thickness value. On the horizontal axis of the graph, the reference "NO" means that the crystallization is not performed, and the reference "700° C." means that the crystallization is performed at 700° C. As shown in the graph, the equivalent oxide thickness value is favorably decreased by performing the crystallization process.

However, the crystallization process has also problems. That is to say, the crystallization process is usually performed at relatively high temperature, thereby generating a lot of grain boundary in the tantalum oxide layer. The grain boundary often acts as a path of leakage current and may induce unfavorable leakage current in the capacitor. Moreover, the crystallization process under relatively high temperature may induce unfavorable deformation of the lower electrode and damage on the tantalum oxide layer.

Meanwhile, it is thought to be difficult to decrease the equivalent oxide thickness value into 10 Å or less in the conventional method, because both nuclear generation and crystal growth occur simultaneously during the crystallization process.

Accordingly, the need remains for a method for forming a capacitor having low leakage current as well as low equivalent oxide thickness.

SUMMARY OF THE INVENTION

It is an object of the present invention to provide a method for forming a semiconductor device with low leakage current in a capacitor.

It is another object of the present invention to provide a method for forming a semiconductor device with high capacitance of a capacitor.

It is another object of the present invention to provide a method for forming a semiconductor device having a capacitor, wherein deformation in a lower electrode is low during forming a capacitor dielectric layer.

According to one aspect of the present invention, a method of fabricating a semiconductor device is provided. The method comprises providing a substrate and forming a lower electrode on the substrate. A first layer is formed on the lower electrode. The material of the first layer as formed is amorphous. The first layer is crystallized. A second layer is formed on the first layer. The first layer is formed of the same material as the second layer. The second layer is formed by expitaxial growth such that the first layer acts as a seed layer and the atomic arrangement of a portion of the first layer is extended into that of a portion of the second layer. The second layer is formed at the same temperature as the first layer. The thickness of the first layer is approximately 11~100% of the thickness of the second layer. The first and second layers are dielectric layers. The first and second layers are preferably tantalum oxide layers. The second layer is crystallized. The first and second layers are crystallized by thermal treatment at a first and a second temperature respectively. The second temperature is lower than the first temperature. An upper electrode is formed on the second layer. The composite layer of the first and the second layers is a capacitor dielectric layer. Optionally, the first and second layers are formed at different temperatures respectively such that the second layer is formed preferably at higher temperature than the first layer. Optionally, the second layer is formed such that the material of the second layer as formed is amorphous.

According to another aspect of the present invention, a method of fabricating a semiconductor device is provided. The method comprises providing a substrate and forming a lower electrode on the substrate. A first layer is formed on the lower electrode. The first layer is crystallized by thermal treatment. A second layer is formed by expitaxial growth on the first layer such that the first layer acts as a seed layer and the atomic arrangement of a portion of the first layer is extended into that of a portion of the second layer. The second layer is crystallized by thermal treatment. An upper electrode is formed on the second layer. The composite layer of the first and the second layers is a capacitor dielectric layer.

According to another aspect of the present invention, a method of fabricating a semiconductor device is provided. The method comprises providing a substrate and forming a lower electrode on the substrate. A first layer is formed on the lower electrode. The first layer is crystallized by thermal treatment. A second layer is formed such that the material of the first layer is amorphous. The second layer is crystallized by thermal treatment. An upper electrode is formed on the second layer. The composite layer of the first and the second layers is a capacitor dielectric layer.

BRIEF DESCRIPTION OF THE DRAWINGS

Other features of the present invention will be more readily understood from the following detailed description of specific embodiments thereof when read in conjunction with the accompanying drawings, in which.

DESCRIPTION OF THE PREFERRED EMBODIMENT

Figure 1:
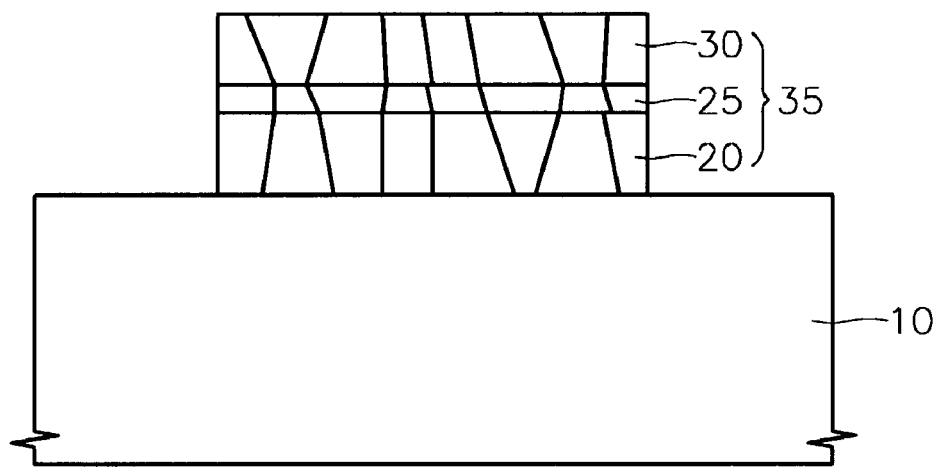
FIG. 1 is cross-sectional views illustrating a conventional method for forming a capacitor using tantalum oxide layer as a capacitor dialectic layer.
Figure 2:
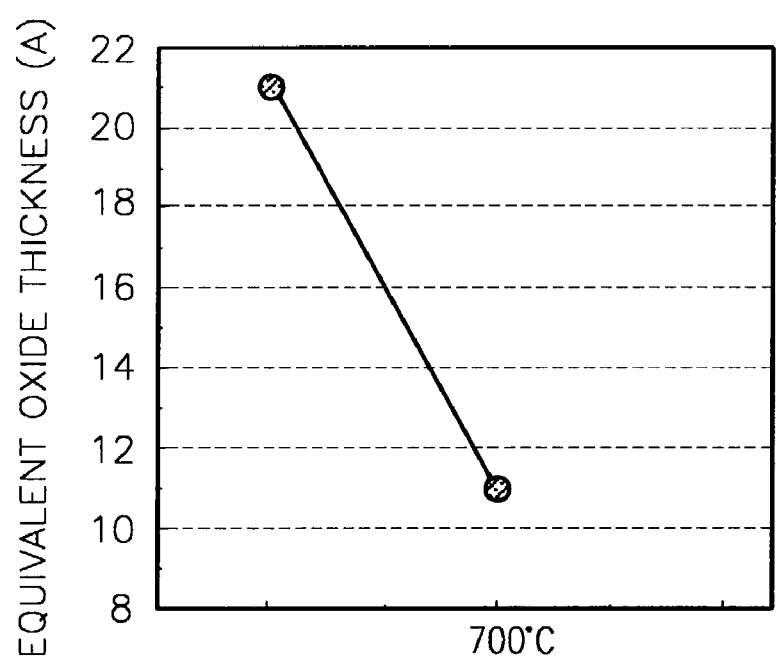
FIG. 2 is a graph showing a change in equivalent oxide thickness value in the conventional method.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the geometrical magnitude of elements may be exaggerated for clarity. In the discussion and claims herein, it will also be understood that when a layer is referred to as being "on" another layer or a substrate, it can be directly on the other layer or the substrate, or intervening layers may also be present.

FIGS. 3a through 3e are cross-sectional views illustrating successive process steps for forming a capacitor according to the present invention. Each time describing following three embodiments of the present invention, the same cross-sectional views, FIGS. 3a through 3e, will be used, even though three embodiments of the present invention is different to each other.

First Embodiment

Figure 3A:
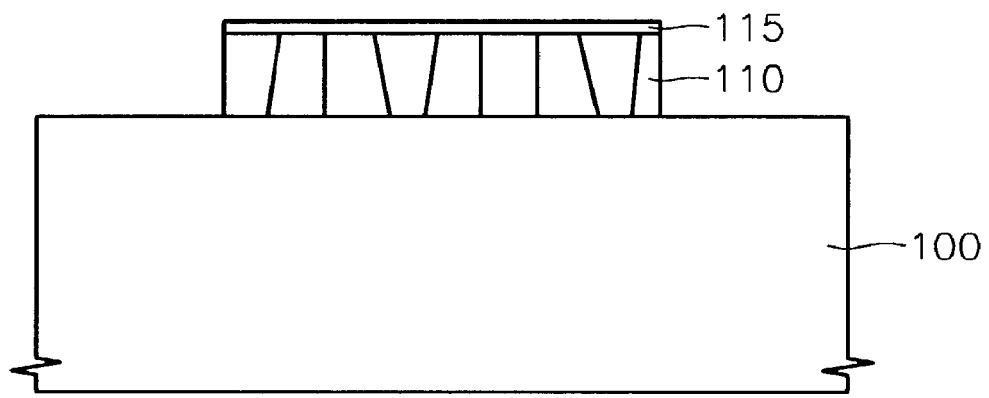
FIGS. 3a through 3e are cross-sectional views illustrating successive process steps for forming a capacitor according to the present invention.

Referring to FIG. 3a, a substrate 100 is provided. Though not shown, the substrate 100 may include transistors, insulating layer, interconnection and so on. A lower electrode 110 is formed on the substrate 100. A noble metal, including platinum, ruthenium, iridium, rhodium and osmium, may be used as material of the lower electrode 110. In this embodiment, the lower electrode 110 is formed of ruthenium, the material of which is crystal. The lower electrode 110 may have three-dimensional structure such as stack, cylinder or concave type structures.

Subsequently, a first layer 115 is formed on the lower electrode 110. The first layer 115 is formed of tantalum oxide. The material of the first layer 115 as deposited is amorphous. The first layer 115 is deposited by a CVD (Chemical Vapor Deposition) at a range of approximately 300 to 500° C., more preferably at a range of 400 to 480° C. The thickness of the first layer 115 in this embodiment is thinner than that of the capacitor dielectric layer 25 in the conventional method. The thickness of the first layer 115 is 50 Å in this embodiment.

Figure 3B:
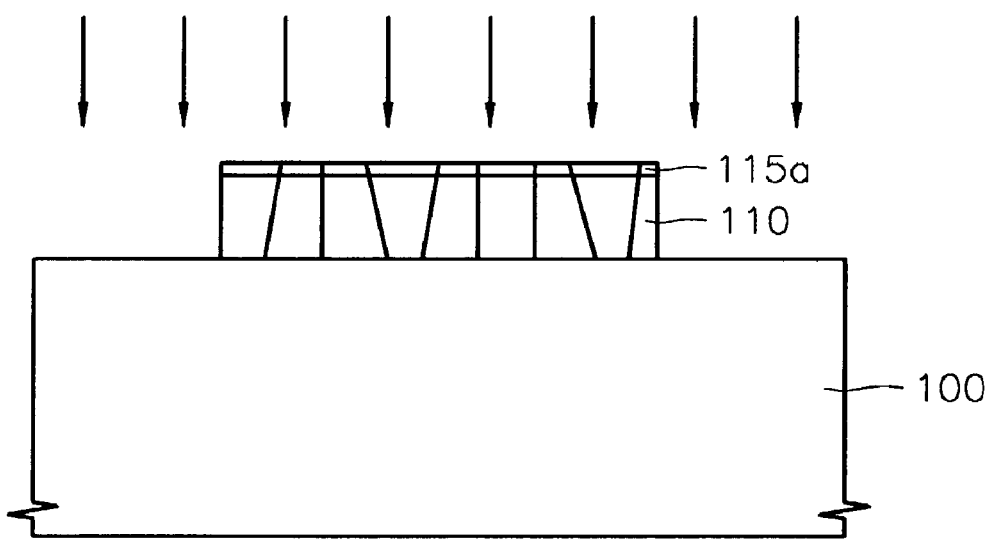

Referring to FIG. 3b, a first thermal treatment is performed to fully crystallize the first layer 115. The reference number '115a' indicates a crystallized first layer, which is the first layer crystallized by the first thermal treatment. The first thermal treatment is performed at a range of approximately 650 to 750° C. under a nitrogen ($N_2$) atmosphere for approximately 5 to 30 minutes. The nitrogen atmosphere may be helpful to minimize oxidation of the lower electrode 110. The process time needed to fully crystallize the first layer 115 in this embodiment is less than the process time needed to fully crystallize the capacitor dielectric layer 25 in the conventional method. This is because that the thickness of the first layer 115 is thinner than that of the capacitor dielectric layer 25. The short process time for performing the first thermal treatment is helpful to minimize the unfavorable deformation of the lower electrode 110.

Figure 3C:
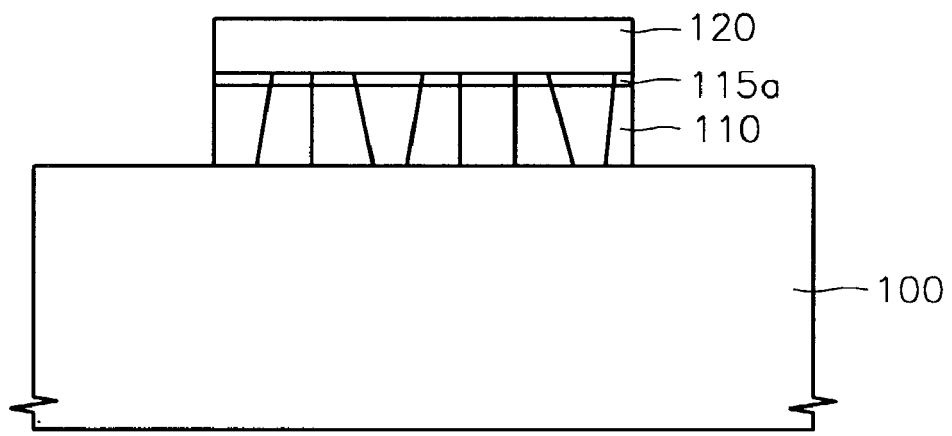

Referring to FIG. 3c, a second layer 120 is formed on the crystallized first layer 115a. The second layer 120 is formed of tantalum oxide by the CVD. The thickness of the second layer is 150 Å in this embodiment. The second layer 120 is deposited at the same temperature as the first layer 115, i.e., at a range of approximately 300 to 500° C., more preferably at a range of 400 to 480° C.

The material of the second layer 120 as deposited is partially crystal. That is to say, the second layer 120 is deposited by expitaxial growth such that the crystalline structure of a portion of the crystallized first layer 115a is partially extended into that of a portion of the second layer 120. In other word, the atomic arrangement of the portion of the crystallized first layer 115a is extended into that of the portion of the second layer 120. During the expitaxial growth, the crystallized first layer 115 acts as a seed layer, thereby maintaining matching in crystal lattice and grain boundary at the interface between the portion of the crystallized first layer 115a and the portion of the second layer 120.

Figure 3D:
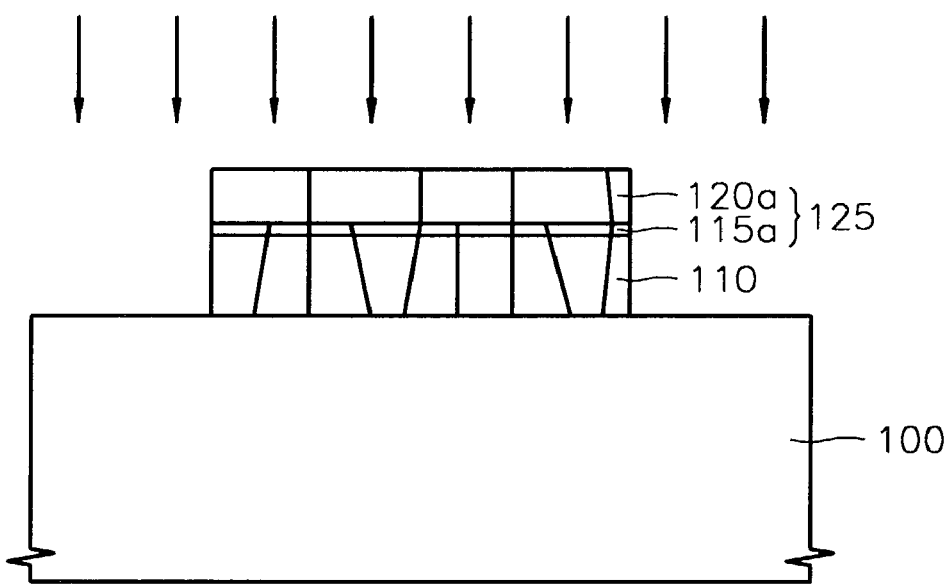

Referring to FIG. 3d, a second thermal treatment is performed to crystallize the second layer 120. The reference number '120a' indicates a crystallized second layer, which is the second layer crystallized by the second thermal treatment. The second thermal treatment is performed at a range of approximately 450 to 650° C. under a nitrogen ($N_2$) atmosphere for approximately 5 to 30 minutes. Even though the temperature of the second thermal treatment is lower than that of the first thermal treatment, the second thermal treatment can readily crystallize the second layer 120 enough to increase the dielectric constant thereof. This is because that the material of the second layer 120 as deposited is partially crystal. The composite layer 125 of the crystallized first layer 115a and the crystallized second layer 120a is a capacitor dielectric layer. Optionally, the second thermal treatment may not be performed.

The thickness of the second layer 120 may be approximately 50~90% of the thickness of the composite layer 125, and the thickness of the first layer 115 may be approximately 10~50% of the thickness of the composite layer 125. In other word, the thickness of the first layer 115 may be approximately 11~100% of the thickness of the second layer 120.

Figure 3E:
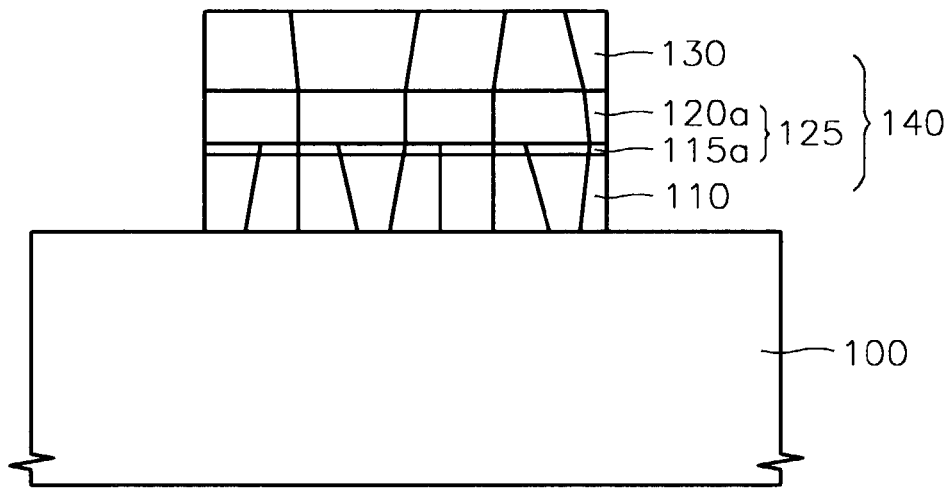

Referring to FIG. 3e, an upper electrode 130 is formed on the composite layer 125, thereby completing a capacitor 140. The noble metal is used as material of the lower electrode 130. In this embodiment, the lower electrode 110 is formed of ruthenium.

Figure 4:
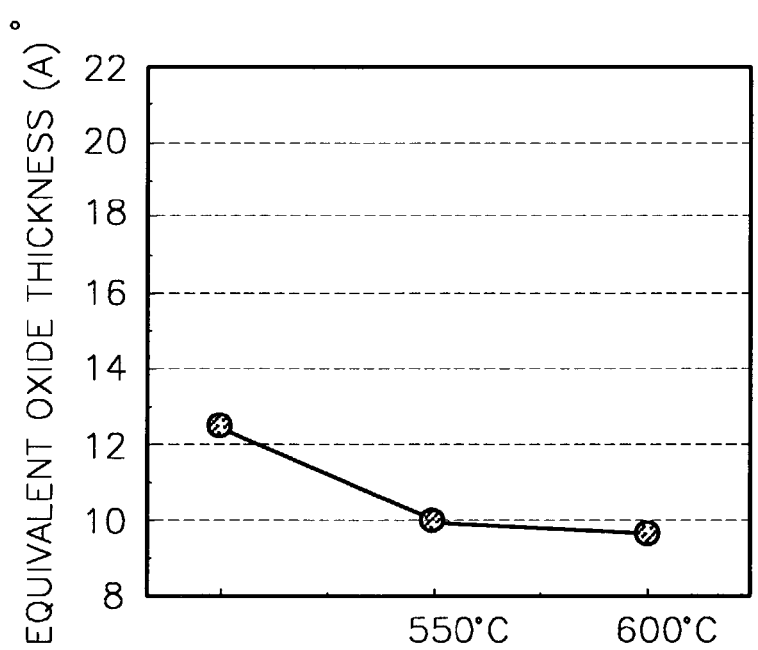
FIG. 4 is a graph showing equivalent oxide thickness value of capacitors formed by a first embodiment.

FIG. 4 is a graph showing equivalent oxide thickness value of capacitors formed by the first embodiment. Referring to FIG. 4, the vertical axis represents equivalent oxide thickness value. On the horizontal axis of the graph, The reference "NO" means that the second thermal treatment is not performed. The references "550° C." and "600° C." mean that the second thermal treatment is performed at 550° C. and 600° C. respectively. As shown in the graph, the equivalent oxide thickness value is favorably decreased into 10 Å or less by performing the second thermal treatment.

FIG. 4 shows that the equivalent oxide thickness value is approximately 12.5 Å, even though the equivalent oxide thickness value is ideally 16.67 Å on the assumption that the material of the second layer 120 as deposited is pure amorphous. In other word, the equivalent oxide thickness value of the capacitor formed by the first embodiment is much lower than the ideal thickness value. This is an evidence that the material of the second layer 120 as deposited is not pure amorphous but partially crystal.

Figure 5:
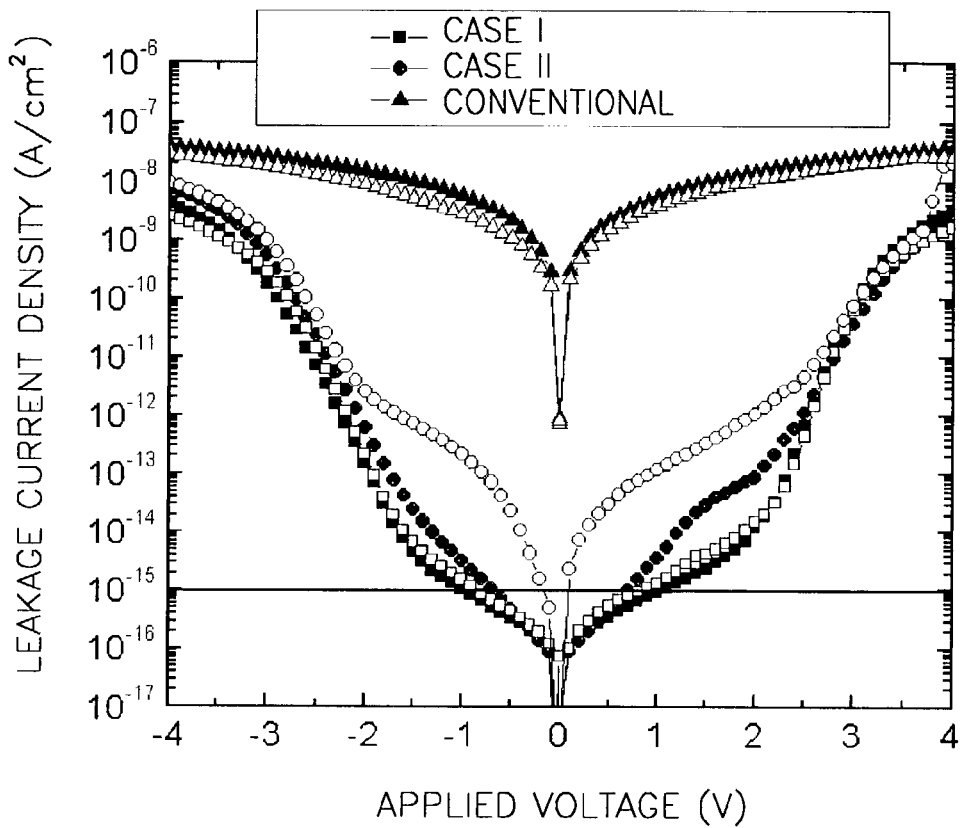
FIG. 5 is a graph showing leakage current density of capacitors formed by the first embodiment and the conventional method.

FIG. 5 is a graph showing leakage current density of capacitors formed by the first embodiment and the conventional method. The reference 'case I' represents data of a capacitor of the first embodiment wherein the second thermal treatment is performed at 550° C. The reference 'case II' represents data of a capacitor of the first embodiment wherein the second thermal treatment is performed at 600° C. The reference 'Conventional' represents data of a capacitor formed by the conventional method. In each case, the first thermal treatment is performed at 700° C. As shown in the graph, the capacitors of the first embodiment have favorably lower leakage current density than that of the conventional method. This is because that the second thermal treatment is performed at relatively low temperature, compared to the conventional method, so that the grain size of the crystallized second layer 120a is relatively big and the amount of grain boundary thereof is relatively little.

Figure 6:
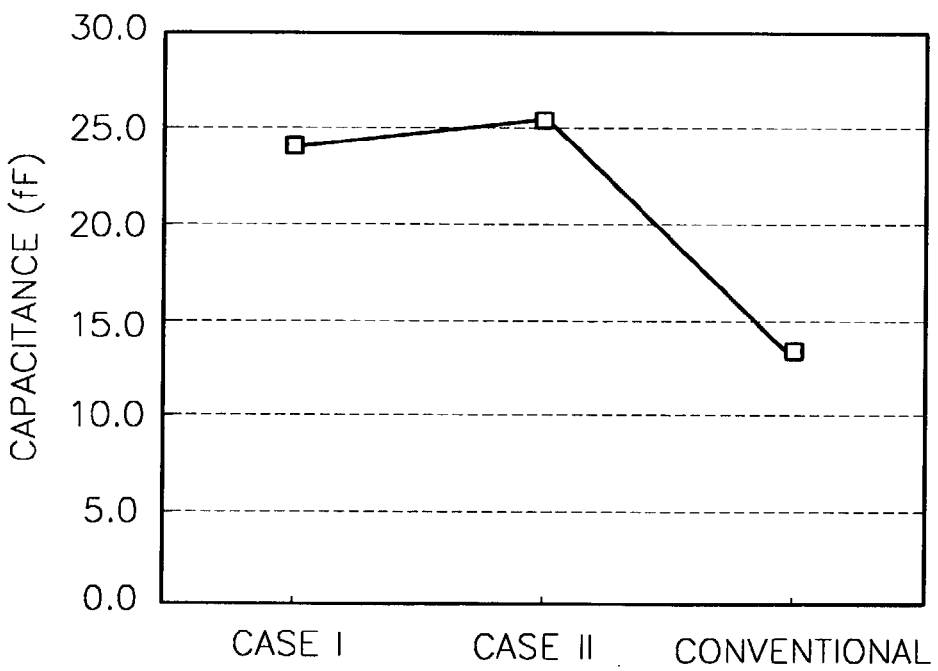
FIG. 6 is a graph showing capacitance of capacitors formed by the first embodiment and the conventional method.

FIG. 6 is a graph showing capacitance of capacitors formed by the first embodiment and the conventional method. The references 'case I', 'case II' and 'Conventional' means the same as those of FIG. 5. As shown in the graph, the capacitors of the first embodiment have favorably higher capacitance than that of the conventional method.

Figure 7:
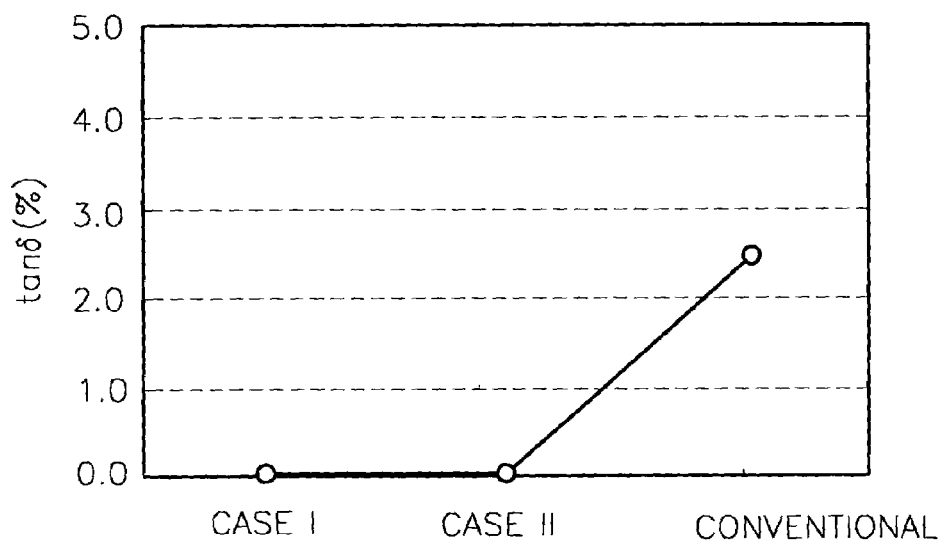
FIG. 7 is a graph showing capacitance loss (tan δ) of capacitors formed by the first embodiment and the conventional method.

FIG. 7 is a graph showing capacitance loss (tan δ) of capacitors formed by the first embodiment and the conventional method. The references 'case I', 'case II' and 'Conventional' means the same as those of FIG. 5. As shown in the graph, the capacitance loss of the capacitors of the first embodiment is favorably almost zero, but that of the conventional method is approximately 2.5%.

According to the first embodiment of the invention, the capacitor dielectric layer is formed by depositing the first layer and the second layer. The second layer is a major portion of the capacitor dielectric layer. The first layer act as a seed layer, while the second layer is expitaxially grown. Accordingly, in contrast to the conventional method, nuclear generation and crystal growth occur separately so that the crystalline characteristic of the capacitor dielectric layer and the capacitance characteristic of the capacitor are enhanced. Moreover, the crystallization of the capacitor dielectric layer occurs at relatively low temperature or for relatively short time, thereby reducing leakage current as well as reducing deformation in the lower electrode and reducing stress at the interface between the lower electrode and the capacitor dielectric layer.

Second Embodiment

The second embodiment is the same as the first embodiment except that the second layer is deposited at the different temperature from that of the first layer. The second embodiment will be described in the following text in detail in conjunction with FIGS. 3a through 3e.

Referring to FIGS. 3a and 3b, by the same processes as the first embodiment, a lower electrode 110 and a first layer are formed on a substrate 100. The first layer 115 is fully crystallized by a first thermal treatment into a crystallized first layer 115a.

Referring to FIG. 3c, a second layer 120 is formed on the crystallized first layer 115a. The second layer 120 is formed of tantalum oxide by the CVD. The second layer 120 is deposited at different temperature from that of the first layer 115.

Even though the second layer 120 is deposited at different temperature from that of the first layer 115, the second layer 120 is deposited by expitaxial growth such that the crystalline structure of a portion of the crystallized first layer 115a is partially extended into that of a portion of the second layer 120. That is to say, the material of the second layer 120 as deposited is partially crystal. The second layer 150 is preferably formed at higher temperature than the first layer 115. In detail, the second layer 120 is formed at a range of 400 to 550° C., while the first layer 115 is formed at a range of 300 to 500° C.

Referring to FIG. 3d, by the same processes as the first embodiment, a second thermal treatment is optionally performed to crystallize the second layer 120 into a crystallized second layer 120a. The composite layer 125 of the crystallized first layer 115a and the crystallized second layer 120a is a capacitor dielectric layer.

Referring to FIG. 3e, by the same processes as the first embodiment, an upper electrode 130 is formed on the composite layer 125, thereby completing a capacitor 140.

Figure 8:
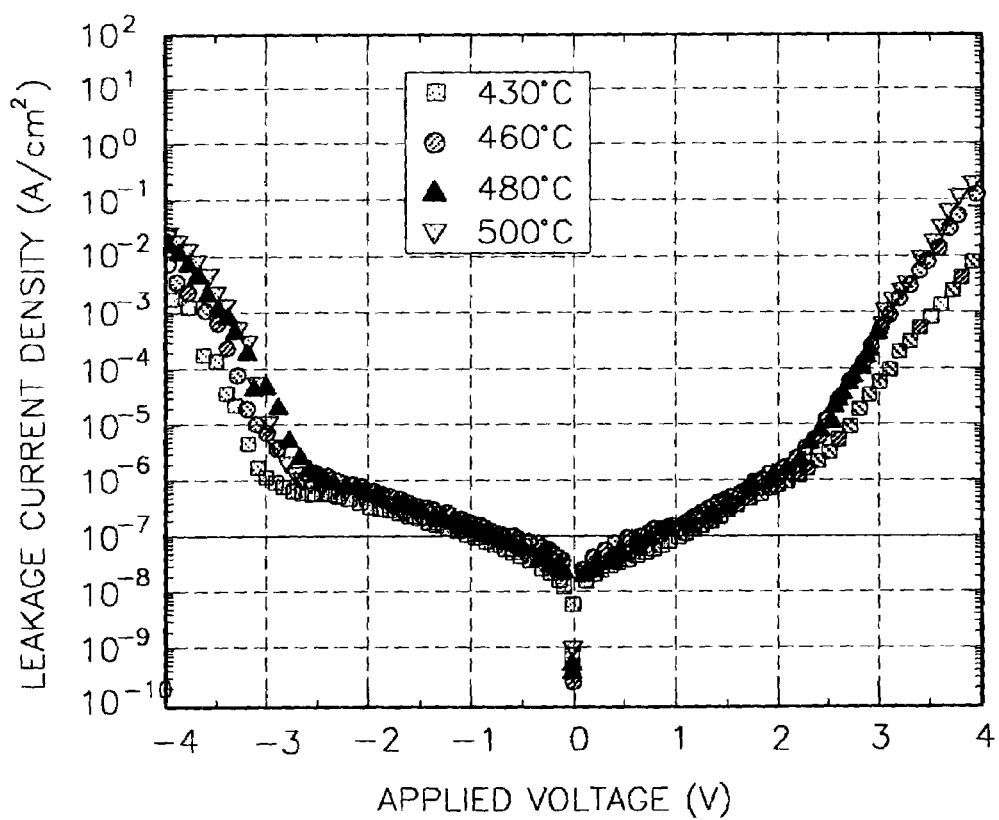
FIG. 8 is a graph showing leakage current density of capacitors formed by the present invention.

FIG. 8 is a graph showing leakage current density of capacitors formed by the present invention. The references "430° C.", "460° C.", "480° C." and "500° C." mean that the second layer 120 is formed at 430° C., 460° C., 480° C. and 500° C. respectively, while the first layer 115 is formed at 430° C. As shown in the graph, there is no significant difference in leakage current density.

Figure 9:
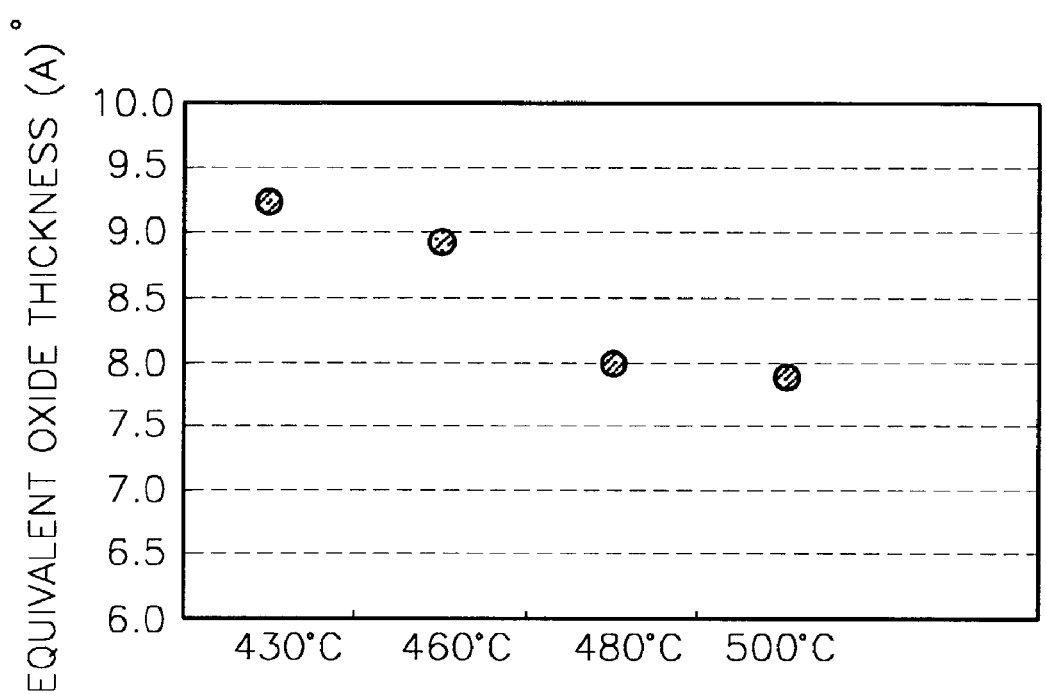
FIG. 9 is a graph showing equivalent oxide thickness value of capacitors formed by the present invention.

FIG. 9 is a graph showing equivalent oxide thickness value of capacitors formed by the present invention. Referring to FIG. 4, the vertical axis represents equivalent oxide thickness value. On the horizontal axis of the graph, the references "430° C.", "460° C.", "480° C." and "500° C." mean the same as those of FIG. 8. As shown in the graph, the higher temperatures for forming of the second layer 120 is, the lower the equivalent oxide thickness value is. Accordingly, it is preferable that the second layer 150 is formed at higher temperature than the first layer 115.

Third Embodiment

The third embodiment is the same as the first and second embodiment except that the material of the second layer 120 as deposited is amorphous. The third embodiment will be described in the following text in detail in conjunction with FIGS. 3a through 3e.

Referring to FIGS. 3a and 3b, by the same processes as the first embodiment, a lower electrode 110 and a first layer are formed on a substrate 100. The first layer 115 is fully crystallized by a first thermal treatment into a crystallized first layer 115a.

Referring to FIG. 3c, a second layer 120 is formed on the crystallized first layer 115a. The second layer 120 is formed of tantalum oxide such that the material of the second layer 120 as deposited is amorphous. The second layer 120 is deposited at a range of 300 to 550° C. The second layer 120 is formed at a different temperature from that of the first layer 115. The second layer 120 may be formed optionally at the same temperature as that of the first layer 115.

Referring to FIG. 3d, by the same processes as the first embodiment, a second thermal treatment is optionally performed to crystallize the second layer 120 into a crystallized second layer 120a. The composite layer 125 of the crystallized first layer 115a and the crystallized second layer 120a is a capacitor dielectric layer.

Referring to FIG. 3e, by the same processes as the first embodiment, an upper electrode 130 is formed on the composite layer 125, thereby completing a capacitor 140.

According to the third embodiment of the present invention, leakage current can be significantly reduced, because the second layer 120 is formed such that the material of the second layer 120 as deposited is amorphous, which has substantially no grain boundary. As mentioned earlier, grain boundary acts as a path of leakage current.

In the drawings and specification, there have been disclosed typical preferred embodiments of the invention. Although specific terms are employed, they are used in a generic and descriptive sense only and not for purpose of limitation. It will be understood by those skilled in the art that various changes in the embodiments may be made without departing from the spirit and scope of the invention. For example, the material of the first and the second layers are not limited to tantalum oxide, but the material of the first and the second layers may be any other high dielectric constant material.

What is claimed is:

1. A method of fabricating a capacitor comprising:
   depositing a first dielectric layer on a substrate, wherein the material of the first dielectric layer is amorphous;
   crystallizing the first dielectric layer; and
   after crystallizing the first dielectric layer, depositing a second amorphous dielectric layer on the first dielectric layer by expitaxial growth such that the crystalline structure of the first crystallized dielectric layer is extended into a portion of the second amorphous dielectric layer, wherein the first dielectric layer is formed of the same material as the second dielectric layer.

2. The method of claim 1, wherein during the expitaxial growth of the second dielectric layer the first dielectric layer acts as a seed layer and the atomic arrangement of a portion of the first dielectric layer is extended into that of a portion of the second dielectric layer.

3. The method of claim 2, which further comprises crystallizing the second dielectric layer.

4. The method of claim 3, wherein the first and second dielectric layers are crystallized by thermal treatment at a first and a second temperature respectively.

5. The method of claim 4, wherein the second temperature is lower than the first temperature.

6. The method of claim 5, wherein the first temperature is within a range of 650 to 750° C. and the second temperature is within a range of 450 to 650° C.

7. The method of claim 2, wherein the first and second dielectric layers are formed at a range of 300 to 550° C.

8. The method of claim 7, wherein the first and second dielectric layers are formed at a range of 400 to 480° C.

9. The method of claim 2, wherein the first dielectric layer is formed at the same temperature as the second dielectric layer.

10. The method of claim 9, wherein the first and second dielectric layers are formed at a range of 300 to 500° C.

11. The method of claim 2, wherein the first and second dielectric layers are formed at different temperatures.

12. The method of claim 11, wherein the second dielectric layer is formed at higher temperature than the first dielectric layer.

13. The method of claim 12, wherein the first dielectric layer is formed at a range of 300 to 500° C. and the second dielectric layer is formed at a range of 400 to 550° C.

14. The method of claim 2, wherein the thickness of the first dielectric layer is approximately 11~100% of the thickness of the second dielectric layer.

15. The method of claim 1, wherein the first and second dielectric layers are tantalum oxide layers.

16. The method of claim 2, which further comprises:
   forming a lower electrode between the substrate and the first dielectric layer; and
   forming an upper electrode on the second dielectric layer;
   wherein the first and the second dielectric layers comprise a capacitor dielectric layer.

17. The method of claim 16, wherein the lower and the upper electrodes are formed of a noble metal.

18. The method of claim 3, wherein the first and second dielectric layers are crystallized by thermal treatment at a first and a second temperature respectively.

19. The method of claim 18, wherein the second temperature is lower than the first temperature.

20. The method of claim 19, wherein the first temperature is within a range of 650 to 750° C. and the second temperature is within a range of 450 to 650° C.

21. The method of claim 1, wherein the first dielectric layer is formed at a range of 300 to 500° C.

22. The method of claim 21, wherein the first dielectric layer is formed at a range of 400 to 480° C.

23. The method of claim 1, wherein the second dielectric layer is formed at a range of 300 to 550° C.

24. A method of fabricating a capacitor comprising:
   depositing a first dielectric layer on a substrate;
   crystallizing the first dielectric layer; and
   after crystallizing the first dielectric layer, depositing a second dielectric layer on the first dielectric layer such that the first dielectric layer acts as a seed layer and the atomic arrangement of a portion of the first dielectric layer is extended into that of a portion of the second dielectric layer.

25. The method of claim 24, wherein the second dielectric layer is formed by expitaxial growth.

26. The method of claim 24, which further comprises crystallizing the second dielectric layer.

27. The method of claim 26, wherein the first and second dielectric layers are crystallized by thermal treatment at a first and a second temperature respectively.

28. The method of claim 27, wherein the second temperature is lower than the first temperature.

29. The method of claim 24, wherein the first dielectric layer is formed at the same temperature as the second dielectric layer.

30. The method of claim 24, wherein the first and second dielectric layers are formed at different temperatures respectively.

31. The method of claim 30, wherein the second dielectric layer is formed at higher temperature than the first dielectric layer.

32. The method of claim 24, which further comprises:
forming a lower electrode between the substrate and the first dielectric layer; and
forming an upper electrode on the second dielectric layer;
wherein the first and the second dielectric layers comprise a capacitor dielectric layer.

33. A method of fabricating a capacitor comprising:
depositing a first amorphous dielectric layer on a substrate;
crystallizing the first dielectric layer; and
depositing a second amorphous dielectric layer on the first crystallized dielectric layer by expitaxial growth such that the atomic arrangement of a portion of the second amorphous dielectric layer is substantially similar to the crystalline structure of the first crystallized dielectric layer.

34. The method of claim 33, which further comprises crystallizing the second dielectric layer.

35. The method of claim 34, wherein the first and second dielectric layers are crystallized by thermal treatment at a first and a second temperature respectively.

36. The method of claim 35, wherein the second temperature is lower than the first temperature.

37. The method of claim 33, which further comprises:
forming a lower electrode between the substrate and the first dielectric layer; and
forming an upper electrode on the second dielectric layer;
wherein the first and the second dielectric layers comprise a capacitor dielectric layer.

* * * * *